United States Patent
Rhee et al.

(10) Patent No.: US 7,879,668 B2
(45) Date of Patent: Feb. 1, 2011

(54) METHOD OF MANUFACTURING A SEMICONDUCTOR DEVICE

(75) Inventors: Hwa-Sung Rhee, Seongnam-si (KR); Ho Lee, Cheonan-si (KR); Myung-Sun Kim, Hwaseong-si (KR); Ji-Hye Yi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 98 days.

(21) Appl. No.: 12/343,134

(22) Filed: Dec. 23, 2008

(65) Prior Publication Data
US 2009/0170254 A1    Jul. 2, 2009

(30) Foreign Application Priority Data
Dec. 26, 2007    (KR) ...................... 10-2007-0137759

(51) Int. Cl.
*H01L 21/8238* (2006.01)
(52) U.S. Cl. ................. 438/199; 257/E21.634
(58) Field of Classification Search .......... 257/E21.634; 438/199
See application file for complete search history.

(56) References Cited

U.S. PATENT DOCUMENTS 7,112,495 B2 * 9/2006 Ko et al. .................... 438/300

2005/0082616 A1    4/2005  Chen et al.
2007/0018252 A1    1/2007  Zhu

FOREIGN PATENT DOCUMENTS

KR    1020070064231    6/2007

OTHER PUBLICATIONS

English Abstract for Publication No. 1020070064231.
* cited by examiner

*Primary Examiner*—Matthew C Landau
*Assistant Examiner*—Sonya D McCall Shepard
(74) *Attorney, Agent, or Firm*—F. Chau & Associates, LLC

(57) ABSTRACT

In a method of manufacturing a semiconductor device, a first gate electrode and a second gate electrode are formed in a first area and a second area of a substrate. Non-crystalline regions are formed in the first area of the substrate adjacent the first gate electrode. A layer having a first stress is formed on the substrate and the first and the second gate electrodes. A mask is formed on a first portion of the layer in the first area of the substrate to expose a second portion of the layer in the second area. The second portion is etched to form a sacrificial spacer on a sidewall of the second gate electrode. The second area of the substrate is partially etched using the mask, the second gate electrode and the sacrificial spacer, to form recesses in the second area of the substrate adjacent the second gate electrode. Patterns having a second stress are formed in the recesses.

20 Claims, 9 Drawing Sheets

METHOD OF MANUFACTURING A SEMICONDUCTOR DEVICE

CROSS-REFERENCE TO RELATED APPLICATIONS

This application claims priority under 35 U.S.C. §119 to Korean patent Application No. 2007-137759, filed on Dec. 26, 2007, the disclosure of which is hereby incorporated by reference herein in its entirety.

BACKGROUND

1. Technical Field

Example embodiments relate to a method of manufacturing a semiconductor device. More particularly, example embodiments relate to a method of manufacturing a semiconductor device including transistors having different conductive types.

2. Description of the Related Art

As information processing apparatuses are being widely used, semiconductor memory devices are being rapidly developed in response to this demand. Current semiconductor devices should have high response speed and large storage capacity. As a result, semiconductor manufacturing technology has been developed to provide a semiconductor device having high integration degree, enhanced reliability, improved response speed, etc.

The semiconductor device employed in the information processing apparatus usually includes a metal oxide semiconductor field effect transistor (MOSFET) as a unit element thereof. The MOSFET may have a reduced size and high integration degree so that the MOSFET may operate with a high response speed at a considerably low voltage.

To improve the response speed of the MOSFET, the channel of the MOSFET may be formed in a strained silicon layer so that the mobility of electrons or holes in the channel may be enhanced. The strained silicon layer may include silicon atoms having extended bonding length or compressed bonding length.

In a MOSFET including a strained silicon layer, the stress generated in a channel for improving the mobility of electrons may be different from that of the channel for enhancing the mobility of holes. Hence, portions of the silicon layer serving channels of an N-typed MOS (NMOS) transistor and a P-typed MOS (PMOS) transistor may have different stresses than each other when the NMOS and PMOS transistors have increased gate-on currents to thereby improve response speeds thereof. For example, the channel of the NMOS transistor may include tensile silicon along the length of the channel when the NMOS transistor is formed on a single crystalline silicon substrate. Here, the gate-on current of the NMOS transistor may be enhanced because the mobility of the electrons corresponding to the majority carrier of the NMOS transistor may be increased, thereby improving the response speed of the NMOS transistor. Further, when the PMOS transistor is provided on the single crystalline silicon substrate, the channel of the PMOS transistor may include compressed silicon in the length of the channel. In this case, the mobility of the holes corresponding to the majority carrier of the PMOS transistor may be enhanced such that the gate on current of the PMOS transistor may be increased. Thus, the PMOS transistor may have improved response speed. However, the NMOS and the PMOS transistor may not be properly on one silicon substrate as the stress in the channel of the NMOS transistor may be different from the stress in the channel of the PMOS transistor.

To settle above-mentioned difficulties, U.S. patent application publication No. 2005/0136583 describes a transistor having high response speed by adjusting stress in a channel region thereof. According to the U.S. patent application publication, a gate electrode and source/drain regions are formed on a silicon substrate, and a layer having tensile stress is formed on the silicon substrate having the gate electrode and the source/drain regions. Then, a thermal treatment process is performed about the substrate so that a channel region of the transistor has a relatively strong tensile stress.

However, the mobility of holes may be reduced when the channel region of the transistor has a strong tensile stress. Thus, a PMOS transistor may not obtained by the technology described in the above U.S. patent application publication. Consequently, additional processes may be required to be executed for obtaining the PMOS transistor to prevent the channel of the PMOS transistor from having tensile stress when the PMOS transistor and an NMOS transistor are formed on one silicon substrate.

SUMMARY

Example embodiments provide a method of manufacturing a semiconductor device including transistors having different conductive types through simplified processes while ensuring enhanced characteristics of the transistors.

In accordance with an example embodiment of the present invention, a method of manufacturing a semiconductor device is provided. The method includes forming a first gate electrode in a first area of a substrate and a second gate electrode is formed in a second area of the substrate, forming non-crystalline regions in the first area of the substrate adjacent to the first gate electrode, forming a layer having a first stress on the substrate, the first gate electrode and the second gate electrode, and forming a mask on a first portion of the layer in the first area of the substrate to expose a second portion of the layer in the second area of the substrate. The method may further include etching the second portion of the layer to form a sacrificial spacer on a sidewall of the second gate electrode, partially etching the second area of the substrate using the mask, the second gate electrode and the sacrificial spacer to form recesses in the second area of the substrate adjacent to the second gate electrode, and forming patterns having a second stress in the recesses.

In example embodiments, the first stress may include tensile stress and the second stress may include compressive stress.

In example embodiments, the non-crystalline regions may be changed into crystalline regions having the first stress while forming the patterns in the recesses.

In example embodiments, the patterns may include silicon germanium.

In example embodiments, the patterns may be formed by a selective epitaxial growth (SEG) process.

In example embodiments, source/drain regions may be formed in the patterns adjacent to the second gate electrode after forming the patterns in the recesses. The source/drain regions may include P-typed impurities.

In example embodiments, additional source/drain regions may be formed in the non-crystalline regions adjacent to the first gate electrode. The additional source/drain regions may include N-typed impurities.

In example embodiments, a thermal treatment process may be performed about the layer. The non-crystalline regions may be changed into crystalline regions having the first stress in the thermal treatment process. The thermal treatment process may be carried out at a temperature of about 700° C. to about 900° C.

In example embodiments, the layer may be formed using silicon nitride by a plasma enhanced chemical vapor deposition process, a rapid thermal chemical vapor deposition process, a furnace chemical vapor deposition process, etc.

In example embodiments, a native oxide film or particles may be additionally removed in the second area of the substrate after forming the recesses. The native oxide film or the particles may be removed by a thermal treatment process performed at a temperature of about 700° C. to about 900° C.

In example embodiments, the non-crystalline regions may be changed into crystalline regions having a third stress during the thermal treatment process. The third stress may include a tensile stress.

In example embodiments, the non-crystalline regions may include impurities such as germanium (Ge), xenon (Xe), carbon (C), fluorine (F), etc.

In example embodiments, source/drain regions may be formed in the first area of the substrate adjacent to the first gate electrode by implanting first impurities into the first area. Halo regions may be formed in the first area of the substrate adjacent to the first gate electrode by implanting second impurities into the first area of the substrate. The source/drain regions may have an N-typed conductivity and the halo regions may have a P-typed conductivity.

In example embodiments, the sacrificial spacer may be removed from the second gate electrode. A first spacer and a second spacer may be formed on sidewalls of the first gate electrode and the second gate electrode, respectively.

According to another aspect of example embodiments, a semiconductor device includes a first transistor and a second transistor having conductivity different from that of the first transistor. The first transistor may have an N-typed conductivity whereas the second transistor may have a P-typed conductivity. For example, the first transistor and the second transistor may correspond to an NMOS transistor and a PMOS transistor, respectively.

The first transistor may include first source/drain regions, a gate insulation layer and a first gate electrode. The first gate electrode may further include a first mask, a first spacer and crystalline regions. The first source/drain regions may have a first stress. For example, the first source/drain regions may have tensile stress. Halo regions may be additionally provide in the first source/drain regions.

The second transistor may include second source/drain regions, a gate insulation layer and a second gate electrode. The second transistor may additionally include a second mask and a second spacer. The second source/drain regions may have a second stress. For example, the second source/drain regions may have compressive stress.

According to example embodiments, the source/drain regions of transistors may have tensile stress and compressive stress as the formations of the layer having the first stress and the patterns having the second stress on the substrate or the removal of the native oxide film, the etched by-products, the particles, etc. Hence, manufacturing processes for the semiconductor device having improved transistors may be simplified in comparison to those used in the conventional art. Further, the source/drain regions of the transistor may have more enhanced tensile stress by thermally treating the layer having the first stress after forming the layer on the source/drain regions. Therefore, the transistor may have improved characteristics such as high response speed.

BRIEF DESCRIPTION OF THE DRAWINGS

Example embodiments can be understood in more detail from the following description taken in conjunction with the accompanying drawings, in which.

DESCRIPTION OF EMBODIMENTS

Figure 1:
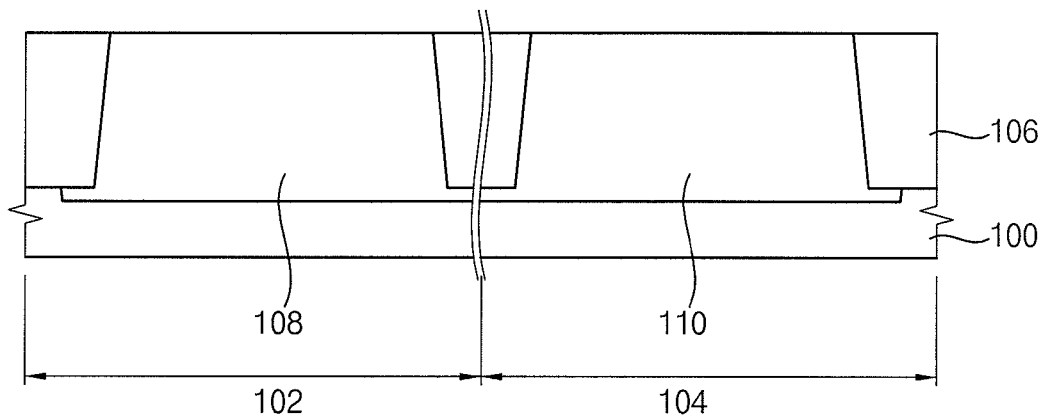
FIGS. 1 to 13 are cross-sectional views illustrating a method of manufacturing a semiconductor device in accordance with example embodiments.

The example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 13 are cross-sectional views illustrating a method of manufacturing a semiconductor device in accordance with example embodiments.

Referring to FIG. 1, a substrate 100 having a first area 102 and a second area 104 is provided. The substrate 100 may include a semiconductor substrate such as, for example, a single crystalline silicon (Si) substrate, a single crystalline germanium (Ge) substrate, a silicon-germanium (Si—Ge) substrate, etc. Alternatively, the substrate 100 may include, for example, a silicon-on-insulator (SOI) substrate, a germanium-on-insulator (GOI) substrate, etc.

An isolation layer 106 is formed on the substrate 100 to define active regions and field regions of the substrate 100. The isolation layer 106 may be formed by an isolation process such as, for example, a shallow trench isolation (STI) process. The isolation layer 106 may include, for example, an oxide such as silicon oxide. For example, the isolation layer 106 may be formed using undoped silicate glass (USG), spin on glass (SOG), phosphor silicate glass (PSG), boro-phosphor silicate glass (BPSG), flowable oxide (FOX), tonen silazene (TOSZ), tetraethyl ortho silicate (TEOS), plasma enhanced-tetraethyl ortho silicate (PE-TEOS), high density plasma-chemical vapor deposition (HDP-CVD) oxide, etc.

First impurities are doped into the first area 102 of the substrate 100 to form a first well 108 in the first area 102. A first transistor may be formed in the first area 102 of the substrate 100. The first transistor may include, for example, an N-typed MOS (NMOS) transistor. The first impurities may have a first conductivity. For example, the first impurities may have a P-typed conductivity when the first transistor includes the NMOS transistor. Here, the first impurities may include, for example, boron (B), boron fluoride (BFx), gallium (Ga), indium (In), etc.

Second impurities are implanted into the second area 104 to form a second well 110 in the second area 104 of the substrate 100. A second transistor may be positioned in the second area 104 of the substrate 100. The second transistor may include, for example, a P-typed MOS (PMOS) transistor. The second impurities may have a second conductivity substantially different from the first conductivity of the first impurities. For example, the second impurities may have an N-typed conductivity when the second transistor includes the PMOS transistor. The second impurities may include, for example, phosphorus (P), arsenic (As), antimony (Sb), etc.

Figure 2:
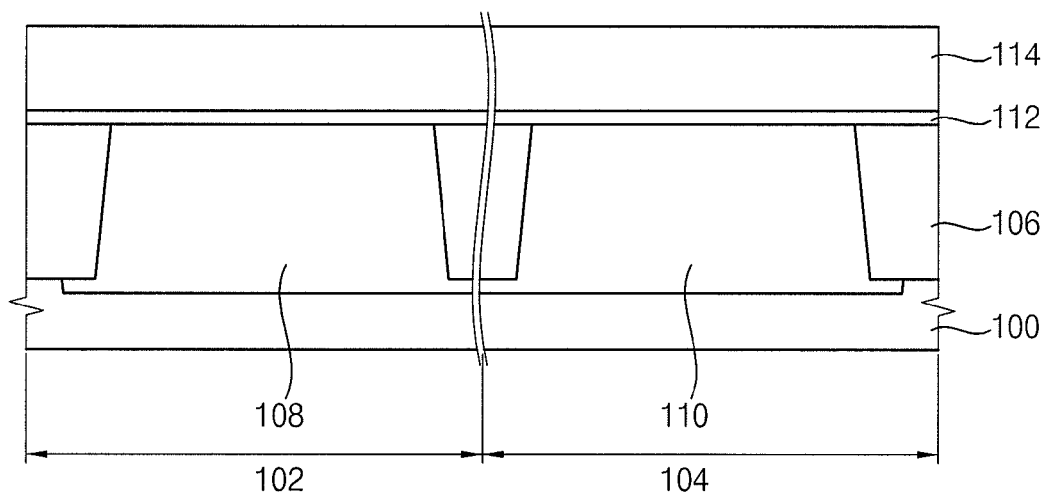

Referring to FIG. 2, a gate insulation layer 112 is formed on the substrate 100 having the first and the second areas 102 and 104. Namely, the gate insulation layer 112 covers the first well 108 and the second well 110. The gate insulation layer 112 may be formed using, for example, an oxide or a metal compound. For example, the gate insulation layer 112 may include silicon oxide, hafnium oxide (HfOx), zirconium oxide (ZrOx), aluminum oxide (AlOx), tantalum oxide (TaOx), etc. These may be used alone or in a mixture thereof. Further, the gate insulation layer 112 may be formed by, for example, a thermal oxidation process, a chemical vapor deposition (CVD) process, an atomic layer deposition (ALD) process, a sputtering process, etc.

A first conductive layer 114 is provided on the gate insulation layer 112. The first conductive layer 114 may have a thickness relatively larger than that of the gate insulation layer 112. The first conductive layer 114 may include, for example, polysilicon, a metal and/or a metal compound. For example, the first conductive layer 114 may be formed using polysilicon doped with impurities, tungsten (W), tungsten nitride (WNx), tungsten silicide (WSix), titanium (Ti), titanium nitride (TiNx), titanium silicide (TiSix), aluminum (Al), aluminum nitride (AlNx), tantalum (Ta), tantalum nitride (TaNx), tantalum silicide (TaSix), cobalt silicide (CoSix), etc. These may be used alone or in a mixture thereof. The first conductive layer 114 may be formed by, for example, a CVD process, a low pressure chemical vapor deposition (LPCVD) process, a plasma enhanced chemical vapor deposition (PECVD) process, a pulsed laser deposition (PLD) process, an ALD process, a sputtering process, an evaporation process, etc. The first conductive layer 114 serves as a first gate electrode 118 and a second gate electrode 120 (see FIG. 3) through a successive etching process.

In example embodiments, the first conductive layer 114 may include a first portion in the first area 102 and a second portion in the second area 104. The first portion of the first conductive layer 114 may include polysilicon doped with third impurities, and the second portion of the first conductive layer 114 may include polysilicon doped with fourth impurities. When the first transistor includes the NMOS transistor and the second transistor includes the PMOS transistor, the third impurities may have an N-typed conductivity whereas the fourth impurities may have a P-typed conductivity. For example, the third impurities in the first portion of the first conductive layer 114 may include phosphorus, arsenic, antimony, etc. Additionally, the fourth impurities in the second portion of the first conductive layer 114 may include, for example, boron, boron nitride, gallium, indium, etc.

In the formation of the first conductive layer 114 including polysilicon according to example embodiments, a first mask may be provided on the second portion of the first conductive layer 114 to expose the first portion of the first conductive layer 114 in the first area 102 of the substrate 100. The first mask may include, for example, a photoresist. Using the first mask as an implantation mask, the third impurities may be doped into the first portion of the first conductive layer 114. Then, the first mask may be removed from the first conductive layer 114. After, a second mask may be formed on the first portion of the first conductive layer 114 to expose the second portion of the first conductive layer 114. Next, the fourth impurities may be implanted into the second portion of the first conductive layer 114 using the second mask as an implantation mask. The second mask may include, for example, a photoresist. The second mask may be removed from the first portion of the first conductive layer 114. The first and the second masks may be removed by, for example, an ashing process and/or a stripping process.

Figure 3:
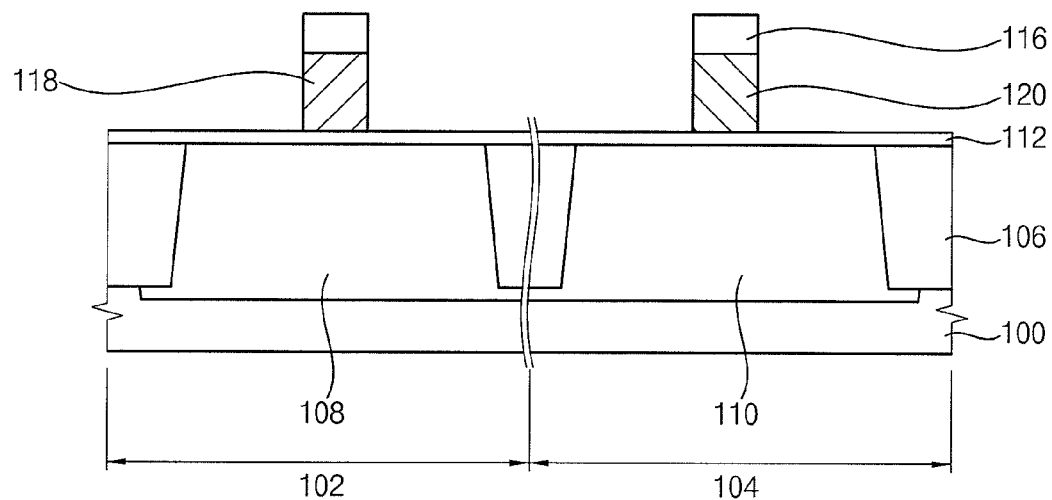

Referring to FIG. 3, third masks 116 are provided on the first conductive layer 114. The third masks 116 serve as gate masks of the first and the second gate electrodes 118 and 120. The third masks 116 may include material that has an etching selectivity relative to the first conductive layer 114. For example, the third masks 116 may be formed using a nitride such as silicon nitride or an oxynitride such as silicon oxynitride. Further, the third masks 116 may be formed by, for example, a CVD process, an ALD process, a sputtering process, an LPCVD process, a PECVD process, etc.

The first conductive layer 114 is etched using the third masks 116 as etching masks. Thus, the first gate electrode 118 and the second gate electrode 120 are provided on the gate insulation layer 112. The first and the second gate electrodes 118 and 120 are positioned in the first and the second areas 102 and 104, respectively. The first and the second gate electrodes 118 and 120 may have conductivities varied in accordance with the conductivities of the first and the second transistors.

In some example embodiments, sides of the first and the second gate electrodes 118 and 120 may be damaged while etching the first conductive layer 114. Hence, a thermal oxidation process may be additionally performed about the first and the second gate electrodes 118 and 120 to cure etched damages to sides of the first and the second gate electrodes 18 and 120.

Figure 4:
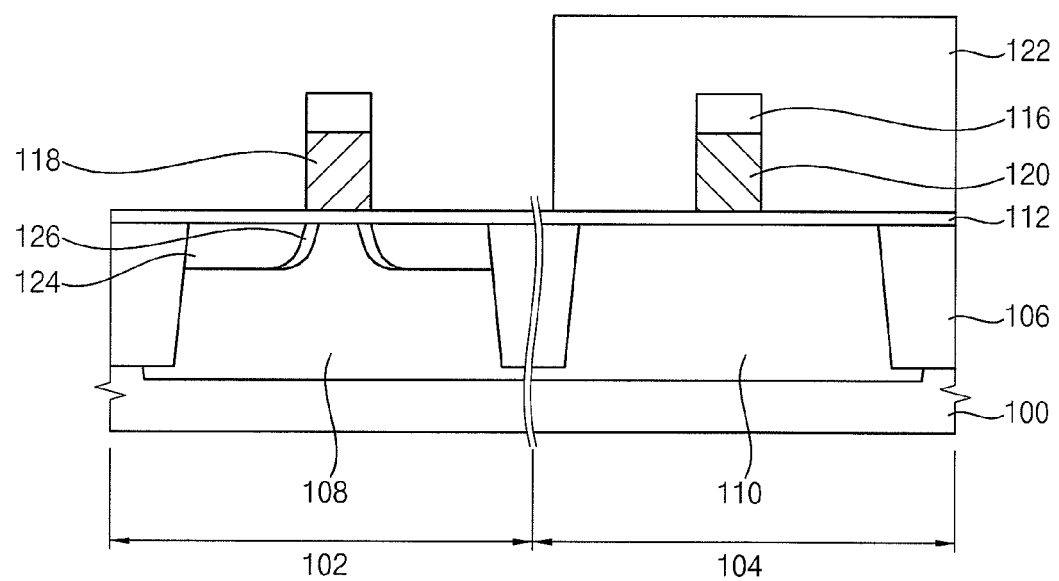

Referring to FIG. 4, a fourth mask 122 is formed on the second area 104 of the substrate 100, so that the first gate electrode 118 and a first portion of the gate insulation layer 112 in the first area 102 of the substrate 100 are exposed. The fourth mask 122 may include, for example, a photoresist. The fourth mask 122 may have a thickness sufficient for covering the second gate electrode 120.

Using the fourth mask 122 as an implantation mask, fifth impurities are implanted into the first well 108 of the first area 102 adjacent to the first gate electrode 118, such that non-crystalline regions 124 are formed adjacent to the first gate electrode 118. The fifth impurities may include, for example, germanium (Ge), xenon (Xe), carbon (C), fluorine (F), etc. In example embodiments, each of the non-crystalline regions 124 may have an impurity concentration in a range of, for example, about $1 \times 10^{13}$ atoms/cm$^2$ and about $5 \times 10^{15}$ atoms/cm$^2$. The non-crystalline regions 124 may be formed at portions of the first well 108 adjacent to the first gate electrode 118.

Still using the fourth mask 122 as an implantation mask, sixth impurities are doped into the portion of the first well 108 adjacent to the first gate electrode 118 to form first source/drain regions 126 in the first well 108. The sixth impurities may have an N-typed conductivity when the first transistor includes the NMOS transistor. For example, the sixth impurities may include phosphorus, arsenic, antimony, etc.

After forming the first source/drain regions 126, the fourth mask 122 is removed from the substrate 100. The fourth mask 122 may be removed by, for example, an ashing process and/or a stripping process.

In example embodiments, the first source/drain regions 126 may be positioned in the non-crystalline regions 124, respectively. That is, the first source/drain regions 126 may be partially overlapped with the non-crystalline regions 124. Here, the first source/drain regions 126 may have depths substantially smaller than those of the non-crystalline regions 124.

In some example embodiments, the first source/drain regions 126 may have depths substantially the same as or substantially similar to those of the non-crystalline regions 126 through a post diffusion process such as, for example, a thermal treatment process. Further, the first source/drain regions 126 may have widths substantially the same as or substantially similar to those of the non-crystalline regions 124.

In example embodiments, halo regions may be formed at portions of the substrate 100 adjacent to the first source/drain regions 126. The halo regions may be formed by implanting seventh impurities into the portions of the substrate 100. The seventh impurities may have conductivity different from that of the sixth impurities. For example, the seventh impurities may have P-typed conductivity. Here, the seventh impurities may include, for example, boron, boron fluoride, gallium, indium, etc. The halo regions may prevent an undesired current from flowing between the first source/drain regions 126 when a first channel region of the first transistor is not induced between the first source/drain regions 126. When the halo regions are provided, the fourth mask 122 may be removed from the substrate 100 after forming the first source/drain regions 126 and the halo regions.

Figure 5:
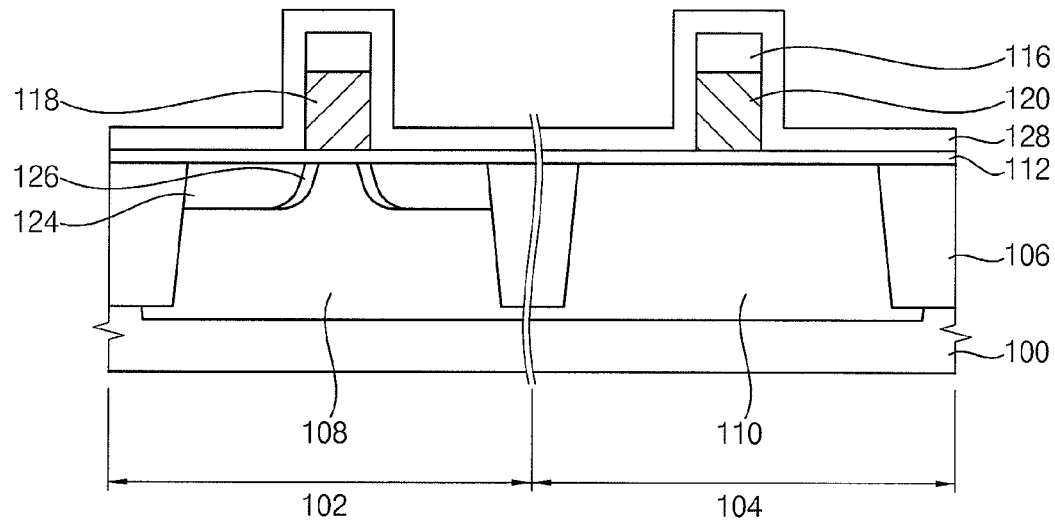

Referring to FIG. 5, a layer 128 is formed on the substrate 100 to cover the gate insulation layer 112, the first gate electrode 118, the first source/drain regions 126 and the second gate electrode 120. The first layer 128 may have a first stress. The first layer 128 may be conformally formed along profiles of the substrate 100, the gate insulation layer 112, the first source/drain regions 126, the first gate electrode 118 and the second gate electrode 120.

In example embodiments, the layer 128 may have tensile stress when the first transistor includes the NMOS transistor. For example, the layer 128 may have tensile stress in a range, for example, between about 1.0 GPa/cm$^2$ to about 3.0 GPa/cm$^2$. The layer 128 may be formed using, for example, a nitride such as silicon nitride. Further, the layer 128 may be formed by, for example, a PECVD process, a rapid thermal CVD process, a furnace CVD process, etc. The layer 128 may have a thickness of, for example, between about 100 Å to about 300 Å based on an upper face of the gate insulation layer 112. However, the thickness of the layer 128 may vary in accordance with a required stress thereof.

In some example embodiments, a thermal treatment process may be performed about the substrate 100 having the layer 128, so that the first area 102 of the substrate 100 having a non-crystalline structure may also have the first stress. That is, the first stress may be induced in the first area 102 through the thermal treatment process. Alternatively, successive thermal treatment processes will be executed on the substrate 100 having the layer 128 while forming the first and the second transistors on the substrate 100. Thus, the thermal treatment process performed for the first area 102 of the substrate 100 may be omitted.

Figure 6:
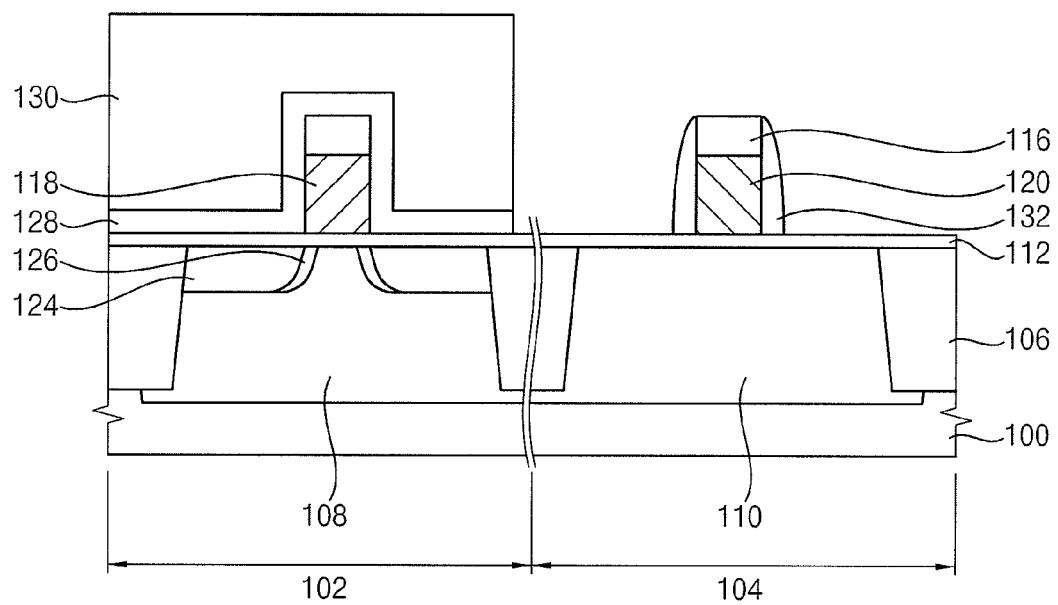

Referring to FIG. 6, a fifth mask 130 is formed on the layer 128. The fifth mask 130 covers a first portion of the layer 128 in the first area 102 whereas the fifth mask 130 exposes a second portion of the layer 128 in the second area 104. For example, the fifth mask 130 may be formed using a photoresist. The fifth mask 130 may be of a sufficient thickness for covering the first gate electrode 118 in the first area 102.

The second portion of the layer 128 is etched using the fifth mask 130 as an etching mask, so that a sacrificial spacer 132 is formed on a sidewall of the second gate electrode 120. Namely, a remaining second portion of the layer 128 may correspond to the sacrificial spacer 132. For example, the sacrificial spacer 132 may be formed by an anisotropic etching process.

Figure 7:
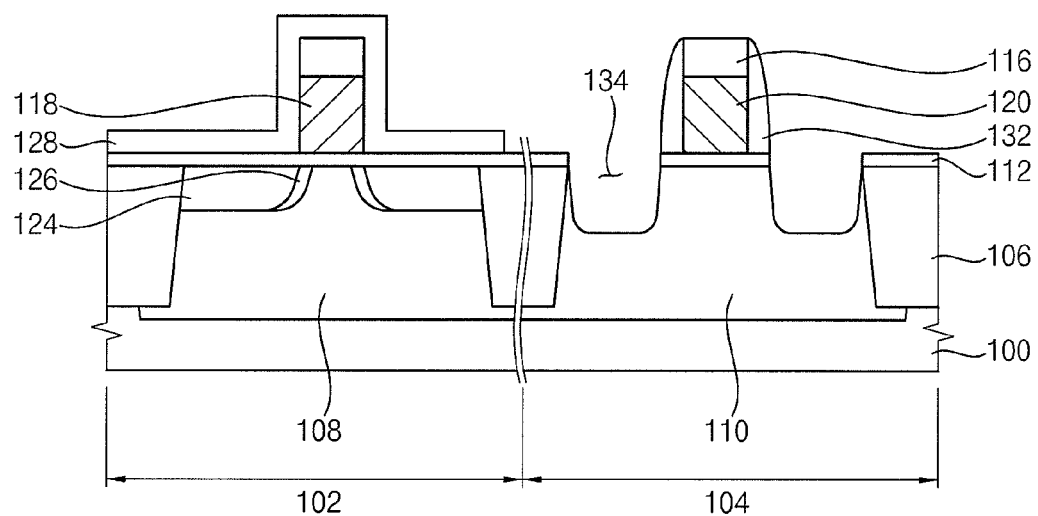

Referring to FIG. 7, portions of the gate insulation layer 112 and the substrate 100 in the second area 104 are etched using the third masks 116, the fifth mask 130 and the sacrificial spacer 132 as etching masks. Thus, recesses 134 are formed at the portions of the substrate 100 adjacent to the second gate electrode 120 in the second area 104. Each of the recesses 134 may have a predetermined depth from an upper face of the substrate 100. For example, the recesses 134 may be formed by an isotropic etching process and/or an anisotropic etching process. The recesses 134 may be adjacent to the isolation layers 106, respectively.

As the portions of the substrate 100 in the second area 104 are etched using the sacrificial spacer 132 provided on the sidewall of the second gate electrode 120, the recesses 134 may be formed without an additional mask. Therefore, the recesses 134 may be obtained through more simplified manufacturing processes than those used in the conventional art.

In example embodiments, the fifth mask 130 is removed from the first portion of the layer 128 after forming the recesses 134 in the second area 104. The fifth mask 130 may be removed from the substrate 100 by, for example, an ashing process and/or a stripping process.

Figure 8:
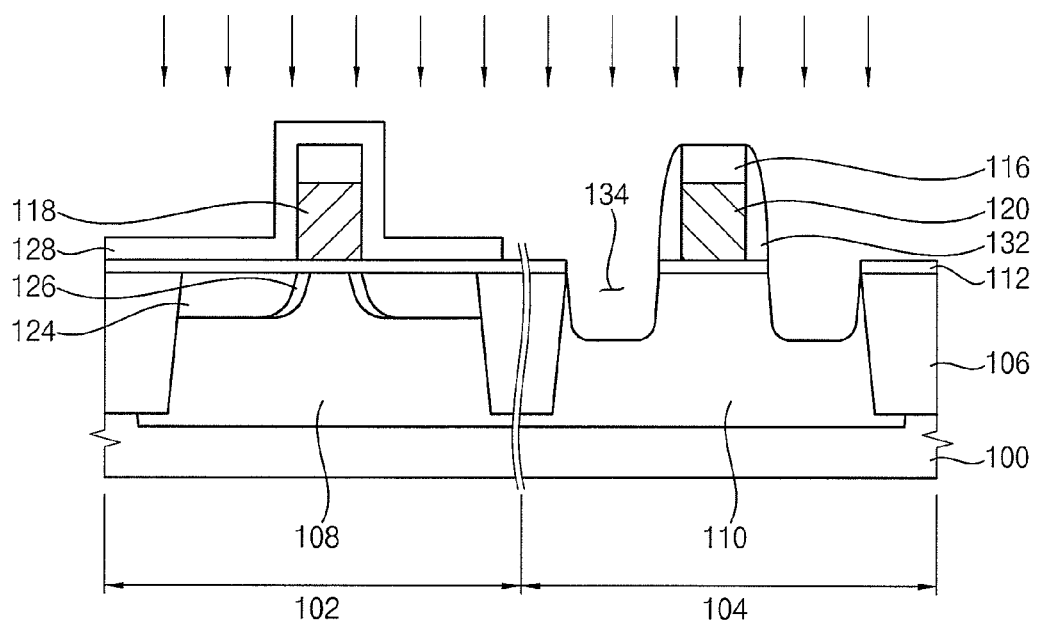

Referring to FIG. 8, a cleaning process is performed about the substrate 100 having the recesses 134 in the second area 104 to remove a native oxide film, etched by-products and/or particles from the recesses 134 and the substrate 100. The cleaning process may include, for example, a wet etching process. For example, the substrate 100 may be cleaned using a cleaning solution that includes a hydrogen fluoride (HF) solution, an ammonium fluoride ($NH_4F$) solution, etc. These may be used alone or in a mixture thereof. However, the cleaning process may be omitted to simplify the manufacturing processes for forming the first and the second transistors.

Figure 9:
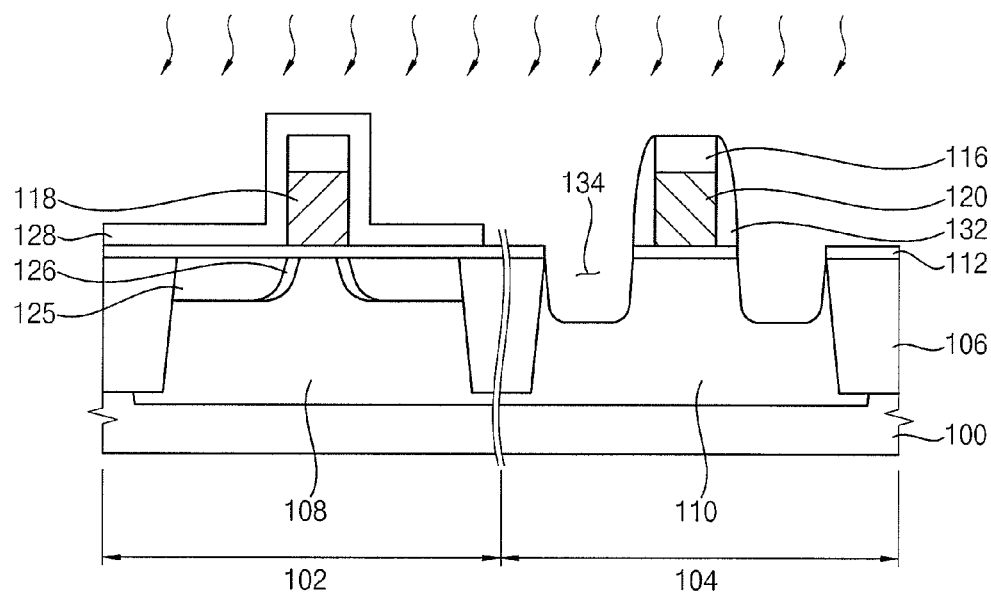

Referring to FIG. 9, a thermal treatment process is executed on the substrate 100 having the recesses 134. The thermal treatment process may be carried out under an atmosphere including, for example, hydrogen (H).

In the thermal treatment process according to example embodiments, the non-crystalline regions 124 in the first area 102 are crystallized so that the non-crystalline regions 124 are changed into crystalline regions 125. Further, the native oxide film, the etched by-products and/or the particles may also be removed from the substrate 100 in the thermal treatment process. The crystalline regions 125 may have the first stress through the thermal treatment process. That is, the crystalline regions 125 may have tensile stress such as the first portion of the layer 128 remaining in the first area 102.

As described above, the first source/drain regions 126 may have the first stress from the thermal treatment process because the first source/drain regions 126 are positioned in the non-crystalline regions 124 or the first source/drain regions 126 are partially overlapped with the non-crystalline regions 124. When the first source/drain regions 126 have the first stress, the first channel region of the first transistor generated between the first source/drain regions 126 may also have the first stress. For example, the first channel region of the first transistor may have tensile stress when the first transistor corresponds to the NMOS transistor.

In example embodiments, the first transistor corresponding to the NMOS transistor is formed in the first area 102 of the substrate 100 when the first gate electrode 118 includes polysilicon doped with N-typed impurities and the first source/drain regions 126 also include N-typed impurities. The first transistor may provide improved electrical characteristics such as, for example, enhanced response speed because of the first source/drain regions 126 having tensile stress through the above-described processes.

In example embodiments, the thermal treatment process may be performed, for example, at a temperature of about 700° C. to about 900° C. for about 3 minutes to about 10 minutes when the halo regions are not provided in the first area 102 of the substrate 100. Alternatively, the thermal treatment process may be carried out, for example, at a temperature of about 550° C. to about 700° C. for about 1 minute to about 2 minutes when the halo regions and the first source/drain regions 126 are formed in the first area 102 of the substrate 100. When the halo regions are provided in the first area 102 of the substrate 100, the thermal treatment process may be executed at a relatively low temperature to prevent diffusions of the seventh impurities in the halo regions.

In some example embodiments, the thermal treatment process may not be performed because a successive thermal treatment process will be carried out as described below. That is, the thermal treatment process may be omitted as the crystalline regions 125 may be formed while forming patterns through successive processes.

Figure 10:
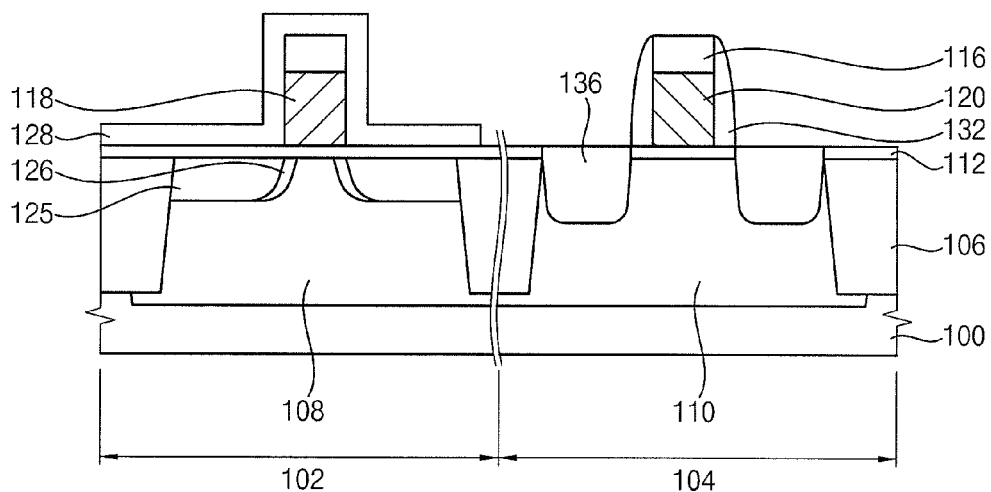

Referring to FIG. 10, the patterns are formed in the recesses 134 in the second area 104 of the substrate 100. The recesses 134 may be filled with the patterns, respectively. Each of the patterns has a second stress substantially different from the first stress. For example, the patterns may have compressive stress when the second transistor includes the PMOS transistor.

The patterns having the second stress may be formed using, for example, silicon germanium. Further, the patterns may be formed by, for example, a selective epitaxial growth (SEG) process. In the selective epitaxial growth process, portions of the substrate 100 corresponding to sidewalls and bottoms of the recesses 134 may serve as seeds for growing the patterns in the recesses 134.

In the SEG process according to example embodiments, a first source gas and a second source gas may be provided on the substrate 100 having the recesses 134 after the substrate 100 is loaded in a reaction chamber. The first source gas and the second source gas may include, for example, silicon and germanium, respectively. For example, the first source gas may include $Si(CH_3)_4$, $Si(C_2H_5)_4$, $Si(N(CH_3)_2)_4$, $SiH_2Cl_2$, $SiH_4$, etc. The second source gas may include $GeH_4$, $Ge(CH_3)_4$, $Ge(C_2H_5)_4$, $Ge(N(CH_3)_2)_4$, etc. Here, for example, the selective epitaxial growth process may be carried out at a temperature of about 550° C. to about 850° C. and a pressure of about 0.01 Torr to about 100 Torr. However, those temperature and pressure may vary in accordance with dimensions of the recesses 134 and the patterns. Each of the patterns filling the recesses 134 may have, for example, a concentration of germanium in a range of about 15 percent to about 40 percent.

In some example embodiments, an additional gas may be provided onto the substrate 100 to enhance an efficiency of forming the patterns while providing the first and the second source gases onto the substrate 100. The additional gas may include, for example, a hydrogen chloride (HCl) gas and/or a hydrogen ($H_2$) gas.

When the patterns are formed in the recesses 134 at the temperature of, for example, about 550° C. to about 850° C., the non-crystalline regions 124 in the first area 102 may be crystallized to form the crystalline regions 125 even though the above-described thermal treatment process is omitted. Each of the crystalline regions 125 may have the first stress as described above. That is, the stress of the crystalline regions 125 may be substantially the same or substantially similar to those of the layer 128 and the first source/drain regions 126. When the crystalline regions 125 are formed through the selective epitaxial growth process, the semiconductor device having the first and the second transistors may be obtained through more simplified processes than those used in the conventional art.

Referring again to FIG. 10, second source/drain regions 136 are formed in the patterns adjacent to the second gate electrode 120. The second source/drain regions 136 may be formed by implanting eighth impurities into the patterns using the second gate electrode 120 and the sacrificial spacer 132 as implantation masks. The eighth impurities may have P-typed conductivity when the second transistor includes the PMOS transistor. For example, the eighth impurities may include boron, boron fluoride, gallium, indium, etc.

In some example embodiments, the eighth impurities may be doped into the patterns by an in-situ process to readily form the second source/drain regions 136 in the second area 104 while forming the patterns having the second stress in the selective epitaxial growth process.

In example embodiments, when the second source/drain regions 136 are positioned in the patterns, the second source/drain regions 136 may have dimensions substantially smaller those of the patterns. Alternatively, the second source/drain regions 136 may have dimensions substantially the same as or substantially similar to those of the patterns.

As the second source/drain regions 136 are located in the patterns having the second stress, the second source/drain regions 136 may also have the second stress. For example, the second source/drain regions 136 may have compressive stress. When the second source/drain regions 136 have the second stress, a second channel region of the second transistor generated between the second source/drain regions 136 may have the second stress. When the second gate electrode 120 and the second source/drain regions 136 include the P-typed impurities, the second transistor corresponding to the PMOS transistor may be formed in the second area 104 of the substrate 100. As the second source/drain regions 136 have compressive stress, the second transistor may have improved characteristics such as enhanced response speed.

According to example embodiments, the first transistor and the second transistor may be provided in the first area 102 and the second area 104, respectively. The first transistor may have conductivity different from that of the second transistor. The first transistor includes the gate insulation layer 112, the first electrode 118 and the first source/drain regions 126 having tensile stress caused by the layer 128. The second transistor includes the gate insulation layer 112, the second gate electrode 120 and the second source/drain regions 136 having compressive stress caused by the patterns. When the first gate electrode 118 and the first source/drain regions 126 include the N-typed impurities, the first transistor may be the NMOS transistor. Further, the second transistor may be the PMOS transistor when the second gate electrode 120 and the second source/drain regions 136 include the P-typed impurities. As the first channel region of the first transistor and the second channel region of the second transistor have tensile stress and compressive stress as described above, the electrical characteristics of the first and the second transistor may be improved.

Figure 11:
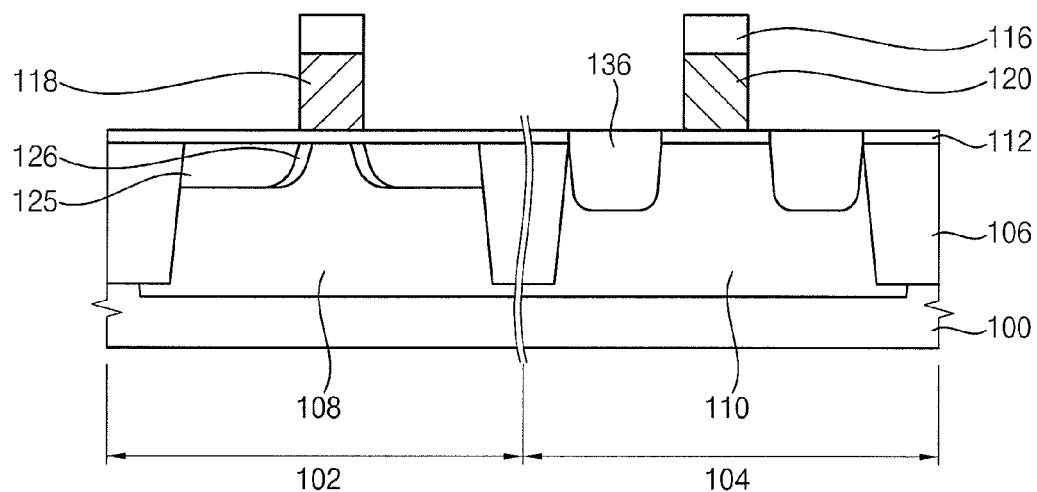

Referring to FIG. 11, the first portion of the layer 128 and the sacrificial spacer 132 are removed from the first and the second areas 102 and 104 of the substrate 100 after forming the second source/drain regions 136. The first portion of the layer 128 and the sacrificial spacer 132 may be etched by, for example, a wet etching process or a dry etching process. When the first portion of the layer 128 and the sacrificial spacer 132 is etched by the wet etching process, the wet etching process may be executed using, for example, an etching solution including a phosphoric acid ($PO_4$) solution. Alternatively, the first portion of the layer 128 and the sacrificial spacer 132 may be etched using, for example, an etching gas including phosphoric acid when the layer 128 and the sacrificial spacer 132 include nitride.

The first and the second gate electrodes 118 and 120 are exposed after removing the first portion of the layer 128 and the sacrificial spacer 132 from the first and the second areas 102 and 104 of the substrate 100.

Figure 12:
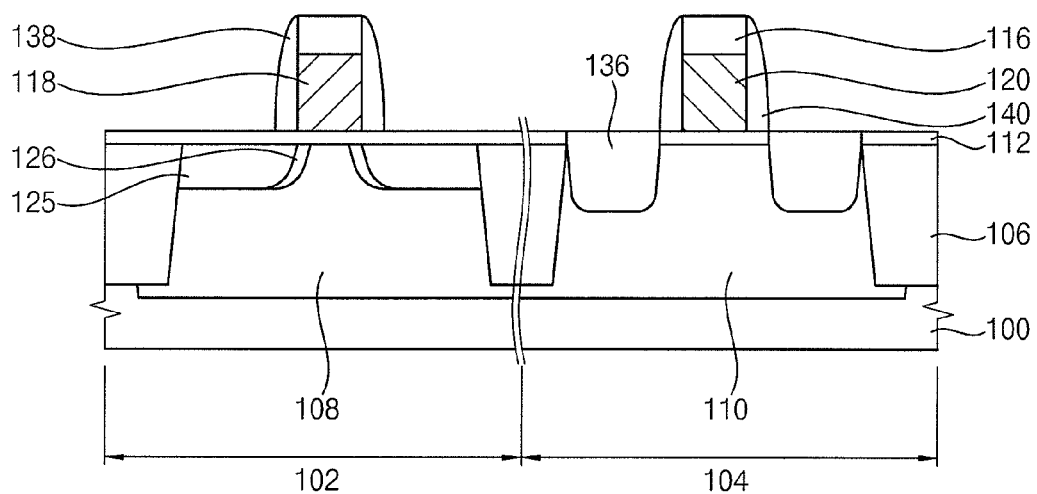

Referring to FIG. 12, a first spacer 138 is formed on a sidewall of the first gate electrode 118, and a second spacer 140 is formed on the sidewall of the second gate electrode 120.

In the formation of the first and the second spacers 138 and 140 according to example embodiments, a spacer formation layer may be formed on the substrate 100 to cover the first and the second gate electrodes 118 and 120. The spacer formation layer may be conformally formed along profiles of the first gate electrode 118, the second gate electrode 120 and the third masks 116. The spacer formation layer may be formed using, for example, a nitride or an oxynitride. For example, the spacer formation layer may include silicon nitride or silicon oxynitride. Further, the spacer formation layer may be formed by, for example, a CVD process, a PECVD process, an ALD process, etc. After the spacer formation layer may be partially etched, the first and the second spacers 138 and 140 may be provided on the sidewalls of the first and the second gate electrodes 118 and 120. The first and the second spacers 138 and 140 may be obtained by, for example, anisotropically etching the spacer formation layer. In example embodiments, each of the first and the second spacers 138 and 140 may have a width substantially the same as or substantially similar to that of the sacrificial spacer 132. Alternatively, the first and the second spacers 138 and 140 may have widths substantially large or small that of the sacrificial spacer 132.

In some example embodiments, the first and the second source/drain regions 126 and 136 may have lightly doped drain (LDD) structures, respectively after forming the first and the second spacers 138 and 140. For example, the first and the second source/drain regions 126 and 136 having the LDD structures may be obtained by implanting additional impurities into the first and the second source/drain regions 126 and 136.

Figure 13:
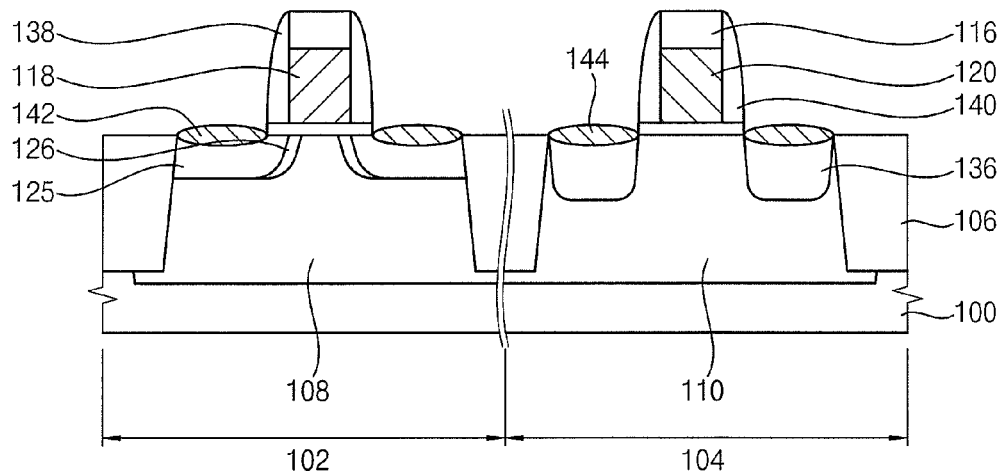

Referring to FIG. 13, a second conductive layer is formed on the substrate 100. The second conductive layer covers the first source/drain regions 126, the first gate electrode 118, the second source/drain regions 136 and the second gate electrode 120. The second conductive layer may be uniformly formed along profiles of the first spacer 138, the first gate electrode 118, the second spacer 140 and the second gate electrode 120.

In example embodiments, the second conductive layer may be formed using a metal. For example, the second conductive layer may include cobalt (Co), titanium (Ti), tantalum (Ta), tungsten (W), aluminum (Al), etc. These may be used alone or in a mixture thereof. The second conductive layer may also be formed by, for example, a CVD process, an ALD process, a sputtering process, an evaporation process, a pulsed laser deposition (PLD) process, etc. The second conductive layer may have a thickness varied considering first and second metal silicide patterns 142 and 144.

The second conductive layer may be thermally treated to form the first metal silicide patterns 142 and the second metal silicide patterns 144. Namely, the first and the second metal silicide patterns 142 and 144 may be formed by, for example, a silicidation process. The first metal silicide patterns 142 are located on the first source/drain regions 126, and the second metal silicide patterns 144 are positioned on the second source/drain regions 136.

The first and the second metal silicide patterns 142 and 144 may be formed in accordance with reactions between the metal in the second conductive layer and silicon included in the first and the second source/drain regions 126 and 136. An unreacted portion of the second conductive layer is removed after forming the first and the second metal silicide patterns 142 and 144. The first metal silicide patterns 142 may reduce contact resistances between the first source/drain regions 126 and plugs, pads or contacts provided on the first source/drain regions 126. Further, the second metal silicide patterns 144 may also reduce contact resistances between the second source/drain regions 126 and plugs, pads or contacts provided on the second source/drain regions 136.

In some example embodiments, the second conductive layer may be formed after removing the third masks 116 from the first and the second gate electrodes 118 and 120. Thus, the second conductive layer may cover the first source/drain regions 126, the second source/drain regions 136, the first gate electrode 118 and the second gate electrode 120. After the silicidation process is performed, additional metal silicide patterns may be formed on the first and the second gate electrodes 118 and 120 besides the first and the second metal silicide patterns 142 and 144. Hence, the gate resistances of the first and the second gate electrodes 118 and 120 may be reduced because of the additional metal silicide patterns.

FIGS. 14 to 17 are cross-sectional views illustrating a method of manufacturing a semiconductor device in accordance with example embodiments.

Figure 14:
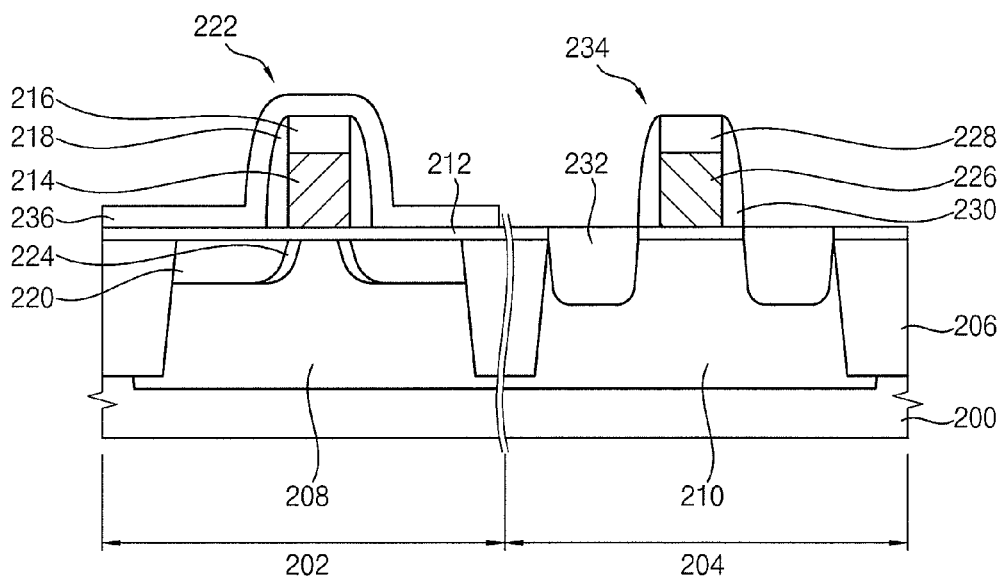
FIGS. 14 to 17 are cross-sectional views illustrating a method of manufacturing a semiconductor device in accordance with example embodiments.

Referring to FIG. 14, an isolation layer 206 is formed on a substrate 200 having a first area 202 and a second area 204. A first transistor 222 is formed in the first area 202 and a second transistor 232 is positioned in the second area 204. The second transistor 232 may have conductivity different from that of the first transistor 222. The substrate 200 may include, for example, a semiconductor substrate, an SOI substrate, a GOI substrate, etc. The isolation layer 206 may be formed using, for example, silicon oxide.

A first well 208 is formed in the first area 202, and a second well 210 is formed in the second area 204 by processes substantially the same or substantially similar to those described with reference to FIG. 1. Further, the first transistor 222 and the second transistor 234 may be formed in the first area 202 and the second 204 of the substrate 200 through processes substantially the same as or substantially similar to those described with reference to FIGS. 2 to 11.

The first transistor 222 includes a gate insulation layer 212, a first gate electrode 214, a first mask 216, a first spacer 218 and first source/drain regions 224. Non-crystalline regions 220 are formed in the first area 202. The non-crystalline region 220 may be at least partially overlapped with the first source/drain regions 224. That is, the first source/drain regions 224 may be positioned in the non-crystalline regions 220 or the first source/drain regions 224 may be partially overlapped with the non-crystalline regions 220.

The second transistor 234 in the second area 204 includes the gate insulation layer 212, a second gate electrode 226, a second mask 228, a second spacer 230 and second source/drain regions 232.

In example embodiments, the first transistor 222 may include a first channel region that has tensile stress when the first source/drain regions 224 have tensile stress as described above. Further, the first transistor 222 may correspond to an NMOS transistor when the first source/drain regions 220 and the first gate electrode 214 include N-typed impurities. The second transistor 234 may include a second channel region having compressive stress when the second source/drain regions 232 have compressive stress. The second transistor 234 may correspond to a PMOS transistor when the second gate electrode 226 and the second source/drain regions 232 include P-typed impurities.

A layer 236 having a stress is formed in the first area 202 to cover the first transistor 222. The layer 236 may be uniformly formed along profiles of the first spacer 218 and the first gate electrode 214. The layer 236 may be formed using, for example, a nitride or an oxynitride. For example, the layer 236 may include silicon nitride or silicon oxynitride. Further, the layer 236 may be formed by, for example, a PECVD process, a rapid thermal CVD process, a furnace CVD process, etc. The layer 236 may have a thickness of, for example, about 200 Å to about 1,000 Å measured from an upper face of the gate insulation layer 212. In example embodiments, the layer 236 may have tensile stress in a range between, for example, about 1.0 GPa/cm$^2$ and about 3.0 GPa/cm$^2$.

Figure 15:
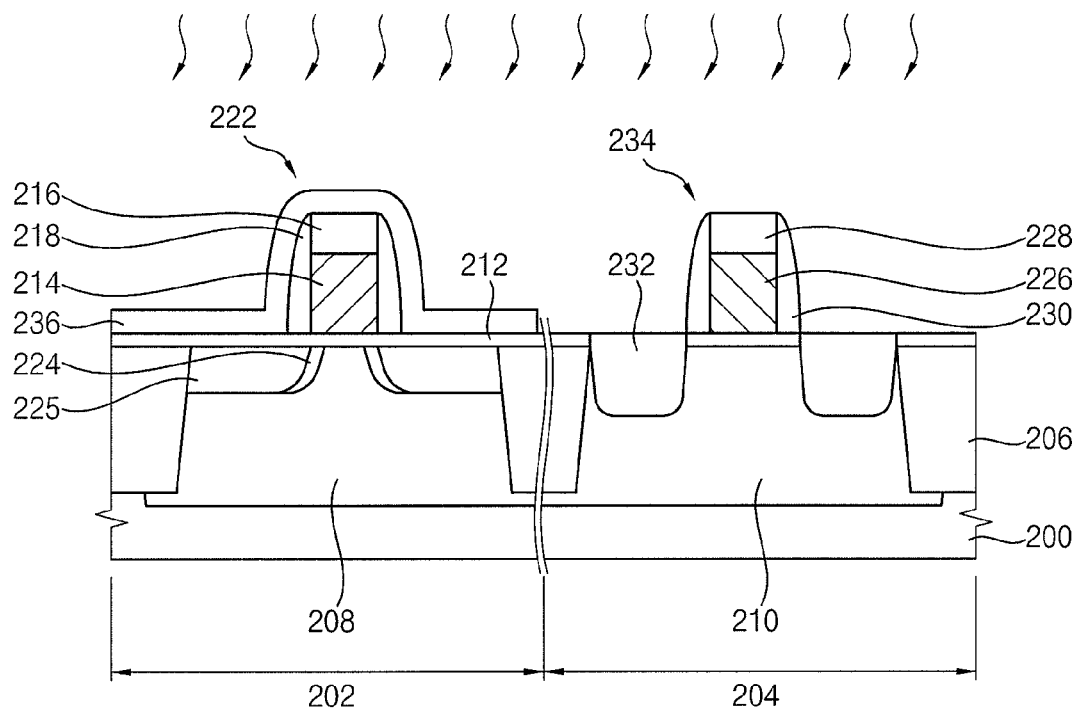

Referring to FIG. 15, the non-crystalline regions 224 are converted into crystalline regions 225 by performing, for example, a thermal treatment process about the substrate 200. The thermal treatment process may be executed under an atmosphere including, for example, hydrogen. For example, the thermal treatment process may be carried out at a temperature of about 550° C. to about 900° C. for about 1 minute to about 10 minutes. In the thermal treatment process, the first source/drain regions 220 may have enhanced tensile stress and the first channel region of the first transistor 222 may also have improved tensile stress, so that the first transistor 222 may have improved electrical characteristics.

Figure 16:
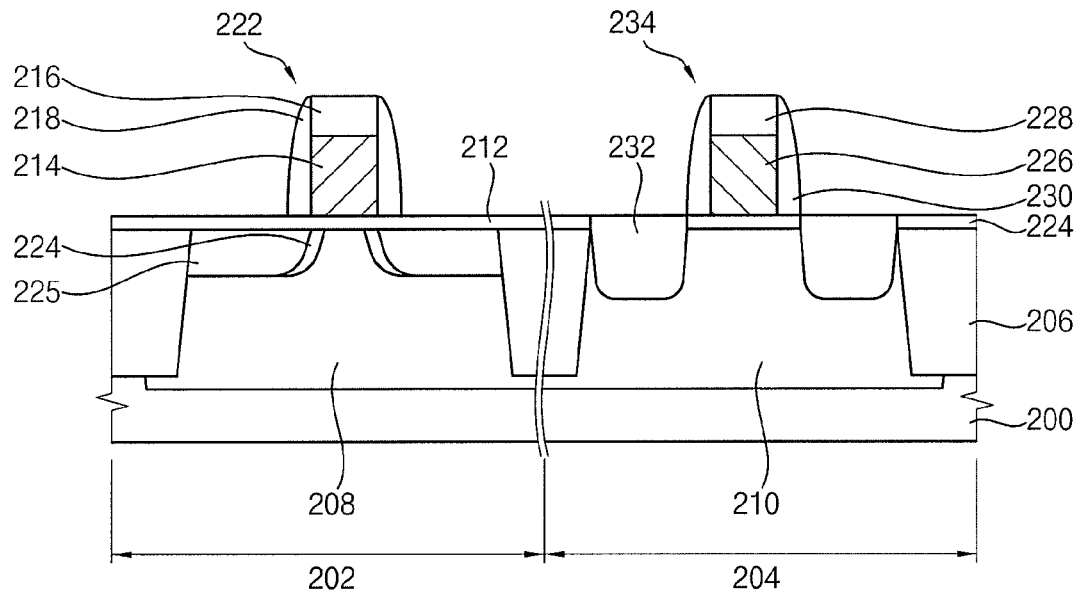

Referring to FIG. 16, the layer 236 is removed from the first transistor 222 in the first area 202 of the substrate 200. The layer 236 may be etched by, for example, a wet etching process or a dry etching process. For example, the layer 236 may be removed using an etching solution including a phosphoric acid solution when the layer 236 is etched by the wet etching process. Alternatively, the layer 236 may be etched using, for example, an etching gas including phosphoric acid when the layer 236 includes nitride. After removing the layer 236, the first gate electrode 214 and the first spacer 218 are exposed in the first area 202 of the substrate 200.

Figure 17:
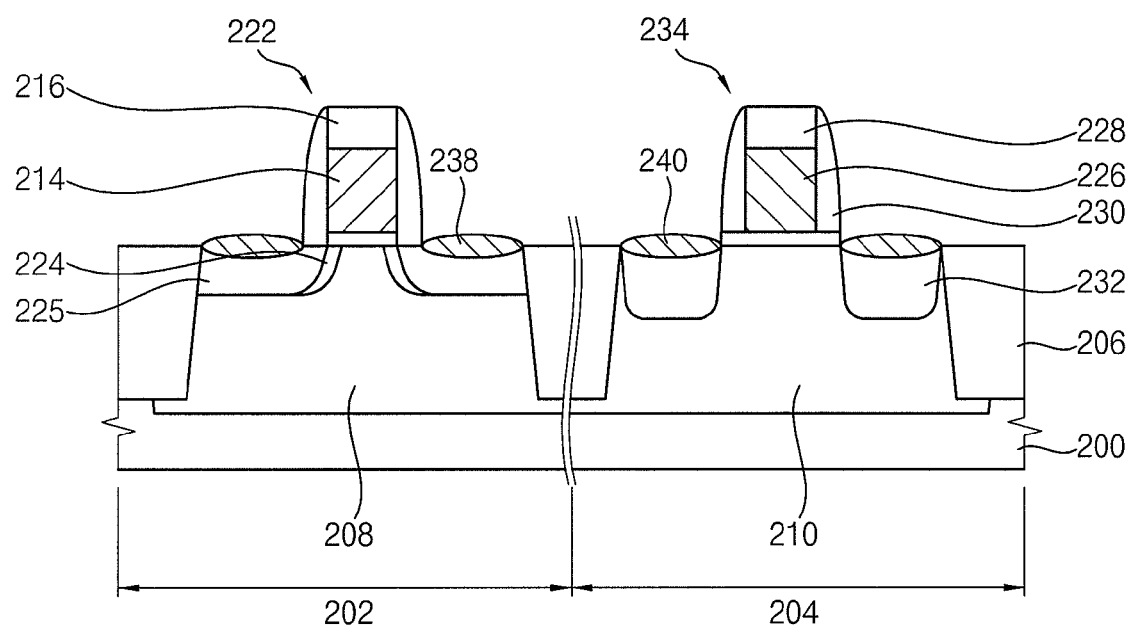

Referring to FIG. 17, a conductive layer is formed on the substrate 200 to cover the first and the second transistors 222 and 234. For example, the conductive layer may be uniformly formed on the gate insulation layer 212, the first and the second gate electrode 214 and 226, the first and the second mask 216 and 228, and the first and the second spacers 218 and 230.

In example embodiments, the conductive layer may be formed using a metal. For example, the conductive layer may include cobalt, tantalum, titanium, tungsten, aluminum, etc. These may be used alone or in a mixture thereof. Further, the conductive layer may be formed by, for example, a sputtering process, a CVD process, an ALD process, an evaporation process, a PLD process, etc.

First and second metal silicide patterns 238 and 240 are formed on the first and the second source/drain regions 224 and 232, respectively. That is, the conductive layer may be, for example, thermally treated to cause reactions metal included in the conductive layer and silicon included in the first and the second source/drain regions 220 and 232, thereby forming the first and the second metal silicide patterns 238 and 240. In other words, the first and the metal silicide patterns 238 and 240 may be formed by, for example, a silicidation process. After forming the first and the second metal silicide patterns 238 and 240, an unreacted portion of the conductive layer may be removed from the substrate 200. The first metal silicide patterns 238 may reduce contact resistances between the first source/drain regions 224 and pads, contacts or plugs formed on the first and the second source/drain regions 224. Further, the second metal silicide patterns 240 may reduce contact resistances between the first source/drain regions 232 and pads, contacts or plugs formed on the first and the second source/drain regions 232.

In some example embodiments, the conductive layer may be formed on upper faces of the first and the second gate electrodes 214 and 226 after removing the first and the second masks 216 and 228 from the first and the second gate electrodes 214 and 226. Here, additional metal silicide patterns may be formed on the first and the second gate electrodes 214 and 226 by, for example, thermally treating the conductive layer when each of the first and the second gate electrodes 214 and 226 includes polysilicon. The additional metal silicide patterns may also reduce gate resistances of the first and the second gate electrodes 214 and 226.

Having described example embodiments, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, comprising:
    forming a first gate electrode in a first area of a substrate;
    forming a second gate electrode in a second area of the substrate;
    forming non-crystalline regions in the first area of the substrate adjacent to the first gate electrode;
    forming first source/drain regions including N-typed impurities in the first area of the substrate adjacent to the first gate electrode;
    forming a layer composed of one of a nitride or an oxynitride and having a first stress which is a tensile stress on the substrate to cover the first gate electrode, the first source/drain regions, and the non-crystalline regions located in the first area of the substrate and to cover the second gate electrode located in the second area of the substrate;
    forming a mask on a first portion of the layer in the first area of the substrate to expose a second portion of the layer in the second area of the substrate;
    etching the second portion of the layer to form a sacrificial spacer on a sidewall of the second gate electrode;
    partially etching the second area of the substrate using the mask, the second gate electrode and the sacrificial spacer to form recesses in the second area of the substrate adjacent to the second gate electrode and wherein the recesses formed in the second area of the substrate are exposed by the first portion of the layer located in the first area of the substrate;
    forming patterns having a second stress which is a compressive stress in the recesses, wherein the patterns formed in the recesses are exposed by the first portion of the layer located in the first area of the substrate; and
    forming second source/drain regions including P-typed impurities in the patterns adjacent to the second gate electrode after forming the patterns in the recesses, wherein the second source/drain regions formed in the patterns are exposed by the first portion of the layer located in the first area of the substrate.

2. The method of claim 1, wherein the non-crystalline regions are changed into crystalline regions having the first stress while forming the patterns in the recesses.

3. The method of claim 1, wherein the patterns include silicon germanium.

4. The method of claim 1, wherein forming of the patterns includes a selective epitaxial growth process.

5. The method of claim 1, further comprising performing a thermal treatment process about the layer wherein the non-crystalline regions are thereby changed into crystalline regions having the first stress in the thermal treatment process.

6. The method of claim 1, wherein the layer is formed using silicon nitride by one of a plasma enhanced chemical vapor deposition process, a rapid thermal chemical vapor deposition process and a furnace chemical vapor deposition process.

7. The method of claim 1, further comprising removing a native oxide film or particles in the second area of the substrate after forming the recesses.

8. The method of claim 1, wherein the non-crystalline regions include impurities selected from the group consisting of germanium (Ge), xenon (Xe), carbon (C) and fluorine (F).

9. The method of claim 1, further comprising:
    forming halo regions in the first area of the substrate adjacent to the first gate electrode by implanting impurities into the first area of the substrate.

10. The method of claim 1, further comprising:
    removing the sacrificial spacer from the second gate electrode; and
    forming a first spacer and a second spacer on sidewalls of the first and the second gate electrodes, respectively.

11. The method of claim 1, wherein the layer has a tensile strength in a range from about 1.0 GPa/cm$^2$ to about 3.0 Gpa/cm$^2$.

12. The method of claim 1, wherein each of the non-crystalline regions have an impurity concentration in a range of from about $1\times10^{13}$ atoms/cm$^2$ to about $5\times10^{15}$ atoms/cm$^2$.

13. The method of claim 3, wherein each of the patterns in the recesses has a concentration of germanium in a range from about 15 percent to about 40 percent.

14. The method of claim 5, wherein the thermal treatment process is carried out at a temperature of about 700° C. to about 900° C.

15. The method of claim 7, wherein removing of the native oxide film or the particles includes a thermal treatment process performed at a temperature of about 700° C. to about 900° C.

16. The method of claim 7, wherein the non-crystalline regions are changed into crystalline regions having a third stress in the thermal treatment process.

17. The method of claim 9, wherein the halo regions have a P-typed conductivity.

18. The method of claim 11, wherein the layer has a thickness from about 100 Å to about 300 Å.

19. The method of claim 11, wherein the layer has a thickness from about 200 Å to about 1000 Å.

20. The method of claim 16, wherein the third stress includes a tensile stress.

* * * * *